United States Patent
Matsumoto et al.

(10) Patent No.: US 8,314,004 B2
(45) Date of Patent: Nov. 20, 2012

(54) SEMICONDUCTOR DEVICE MANUFACTURING METHOD

(75) Inventors: Kenji Matsumoto, Yamanashi (JP); Hitoshi Itoh, Yamanashi (JP); Hiroshi Sato, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/356,812

(22) Filed: Jan. 24, 2012

(65) Prior Publication Data

US 2012/0122289 A1    May 17, 2012

Related U.S. Application Data

(62) Division of application No. 12/720,831, filed on Mar. 10, 2010, now Pat. No. 8,124,492.

(30) Foreign Application Priority Data

Mar. 11, 2009    (JP) .................................. 2009-058056

(51) Int. Cl.
 *H01L 21/20*    (2006.01)
(52) U.S. Cl. . 438/396; 438/239; 438/381; 257/E21.008; 257/E21.011
(58) Field of Classification Search .................. 438/171, 438/190; 257/E21.015, E21.35, E21.364
See application file for complete search history.

(56) References Cited

U.S. PATENT DOCUMENTS

| 2004/0166672 | A1  | 8/2004  | Reinberg |
| 2004/0196620 | A1* | 10/2004 | Knudsen et al. .............. 361/311 |
| 2006/0205170 | A1  | 9/2006  | Rinne |

FOREIGN PATENT DOCUMENTS

| JP | 08-195328 A   | 7/1996 |
| JP | 2006-324363 A | 11/2006 |

OTHER PUBLICATIONS

U.S. Office action for U.S. Appl. No. 12/720,831 dated Dec. 23, 2010.
U.S. Office action for U.S. Appl. No. 12/720,831 dated Jul. 15, 2011.

* cited by examiner

*Primary Examiner* — Cheung Lee
(74) *Attorney, Agent, or Firm* — Pearne & Gordon LLP

(57) ABSTRACT

Provided is a semiconductor device manufacturing method for a capacitor having a dielectric film which can be formed into a thin film, can be formed at a low temperature, and has a readily controllable property. The manufacturing method includes: forming, on a conductor for serving as one electrode of a capacitor, a manganese oxide film for serving as a dielectric film of the capacitor; and forming, on the manganese oxide film, a conductive film for serving as the other electrode of the capacitor.

4 Claims, 10 Drawing Sheets

SEMICONDUCTOR DEVICE MANUFACTURING METHOD

CROSS-REFERENCE TO RELATED APPLICATION

This is a divisional application of U.S. patent application Ser. No. 12/720,831 filed on Mar. 10, 2010, which claims the benefit of Japanese Patent Application No. 2009-058056, filed on Mar. 11, 2009, the entire disclosures of which are incorporated herein by reference.

FIELD OF THE INVENTION

The present disclosure relates to a manufacturing method for a semiconductor device, and, more particularly, to a method for forming a dielectric film of a capacitor.

BACKGROUND OF THE INVENTION

Conventionally, high integration and miniaturization of a semiconductor memory device, represented by a DRAM (Dynamic Random Access Memory), have been under way. As for the DRAM, miniaturization of a capacitor is especially important.

If, however, the capacitor is simply miniaturized, its capacitor area is reduced, and, thus, its capacitance is also reduced. Thus, in order to obtain a sufficient capacitance, many attempts have been made to increase a dielectric constant of a dielectric film of the capacitor as well as to reduce a thickness of the dielectric film.

Recently, a material having a high dielectric constant $\in$ tends to be used to form the dielectric film of the capacitor. For example, $Ta_2O_5$ ($\in$=about 25), $Al_2O_3$ ($\in$=about 10), BST [=(Ba, Sr)$TiO_2$] ($\in$=about 200~500), STO [=$SrTiO_3$] ($\in$=about 100~200), and so forth are being used instead of generally utilized $SiO_2$ ($\in$=about 4.1) or $Si_3N_4$ ($\in$=about 7~8) (see, for example, Patent Documents 1 and 2).

Patent Document 1: Japanese Patent Laid-open Publication No. H8-195328

Patent document 2: Japanese Patent Laid-open Publication No. 2006-324363

BRIEF SUMMARY OF THE INVENTION

Since, however, reduction of the thickness of the dielectric film of the capacitor results in an increase of a leakage current, any more reduction of the film thickness is getting difficult. For example, 10 nm is regarded as a lower limit of the film thickness even in case that $SiO_2$, which is deemed to be a material that can be made thinnest in current technology, is used.

Furthermore, in current technology, a high film forming temperature is required for the dielectric film material of the capacitor. The film forming temperature is about 900° C. to about 1000° C. for thermal oxidized $SiO_2$ by thermal oxidation; about 700° C. to about 900° C. for $Si_3N_4$ by thermal CVD; about 400° C. to about 500° C. for $Ta_2O_5$ by thermal CVD; and about 400° C. to about 450° C. for $Al_2O_3$ by thermal CVD. Thus, application of such a dielectric film material to a system LSI including a combination of a memory device and a logic device has been difficult.

Moreover, since a multi-element oxide film such as BST or STO has a complicated film structure and its characteristics readily change depending on its composition, control of its film property is difficult. Thus, it may be difficult to obtain a high quality film.

Further, in a MIM (Metal-Insulator-Metal) structure, when the dielectric film of the capacitor is formed, deterioration of capacitor characteristics may be caused due to oxidation of an underlying metal electrode.

In view of the foregoing, the present disclosure provides a semiconductor device manufacturing method for a capacitor having a dielectric film which can be formed into a thin film, can be formed at a low temperature, and has a readily controllable property.

In order to solve the above-mentioned problem, in accordance with a first embodiment of the present disclosure, there is provided a semiconductor device manufacturing method including: forming an oxide film or an oxynitride film on a conductor for serving as one electrode of a capacitor; forming, on the oxide film or the oxynitride film, a manganese oxide film for serving as a dielectric film of the capacitor; and forming, on the manganese oxide film, a conductive film for serving as the other electrode of the capacitor.

Further, in accordance with a second embodiment of the present invention, there is provided a semiconductor device manufacturing method including: forming, on a conductor for serving as one electrode of a capacitor, a manganese oxide film for serving as a dielectric film of the capacitor; and forming, on the manganese oxide film, a conductive film for serving as the other electrode of the capacitor.

In accordance with a third embodiment of the present disclosure, there is provided semiconductor device manufacturing method including: forming, on a conductor for serving as one electrode of a capacitor, a manganese oxide film for serving as a dielectric film of the capacitor; forming, on the manganese oxide film, a dielectric material film for serving as the dielectric film of the capacitor along with the manganese oxide film; and forming, on the dielectric material film, a conductive film for serving as the other electrode of the capacitor.

In accordance with the present disclosure, there is provided a semiconductor device manufacturing method for a capacitor having a dielectric film which can be formed into a thin film, can be formed at a low temperature, and has a readily controllable property.

BRIEF DESCRIPTION OF THE DRAWINGS

The disclosure may best be understood by reference to the following description taken in conjunction with the following figures.

DETAILED DESCRIPTION OF THE INVENTION

Figure 1A:
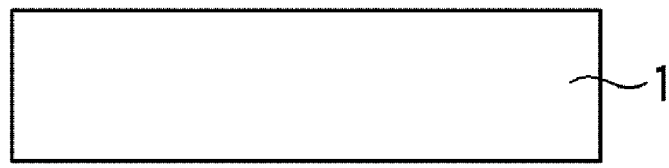
FIGS. 1A to 1D are cross sectional views illustrating an example semiconductor device manufacturing method in accordance with a first embodiment of the present disclosure.
Figure 1B:
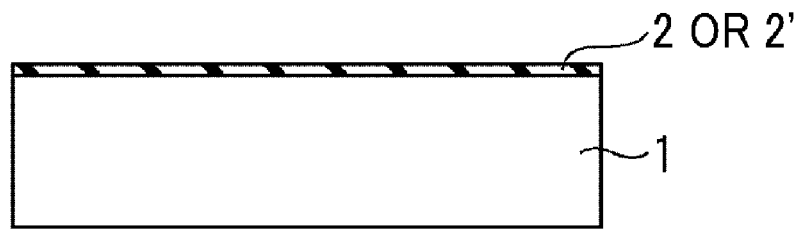
Figure 1C:
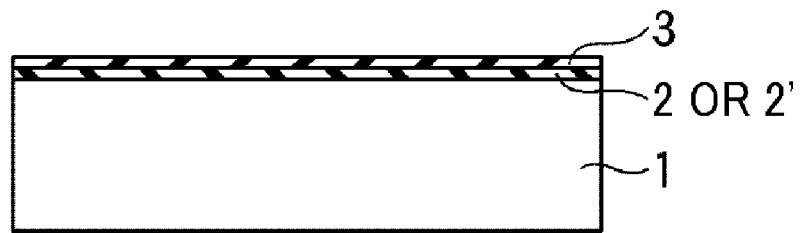
Figure 1D:
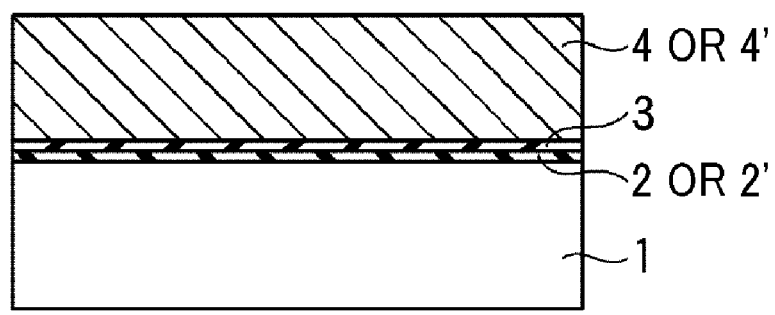

Hereinafter, embodiments of the present disclosure will be described with reference to the accompanying drawings. Through the whole documents, same parts will be assigned same reference numerals.

(First Embodiment)
(Manufacturing Method)

FIGS. 1A to 1D are cross sectional views illustrating an example semiconductor device manufacturing method in accordance with a first embodiment of the present disclosure. FIGS. 1A to 1D illustrate a manufacturing process for a capacitor having a MIS (Metal-Insulator-Semiconductor) structure. Among various structures formed on a semiconductor substrate (e.g., a silicon wafer), only the capacitor is illustrated in FIGS. 1A to 1D, while the rest are omitted.

First, by cleaning the semiconductor substrate (not shown) with a cleaning/drying apparatus, a lower electrode (e.g., polysilicon) 1 is cleaned and dried (see FIG. 1A).

Then, an oxide film 2 is formed on the lower electrode 1 by oxidizing the lower electrode 1 with an oxidizing apparatus. Alternatively, an oxynitride film 2' may be formed on the lower electrode 1 by oxynitiriding the lower electrode 1 with an oxynitriding apparatus (see FIG. 1B).

Subsequently, a manganese oxide film 3 is formed on a surface of the oxide film 2 or the oxynitride film 2' by a manganese oxide CVD apparatus. In this case, a film forming temperature ranges from, e.g., about 100° C. to about 200° C. Both manganese oxide film 3 and the oxide film 2 (or the oxynitride film 2') serve as a dielectric film of the capacitor. For example, in the formation of the manganese oxide film 3, vapor of a manganese-containing organic compound is used, but an oxygen-containing gas is not used. An oxygen source for the manganese oxide film 3 is the oxide film 2 or the oxynitride film 2' (see FIG. 1C).

Thereafter, an upper electrode 4 made of a material such as copper is formed on the manganese oxide film 3 by a PVD apparatus. Alternatively, an upper electrode 4' made of polysilicon may be formed by a CVD apparatus (see FIG. 1D).

Figure 2:
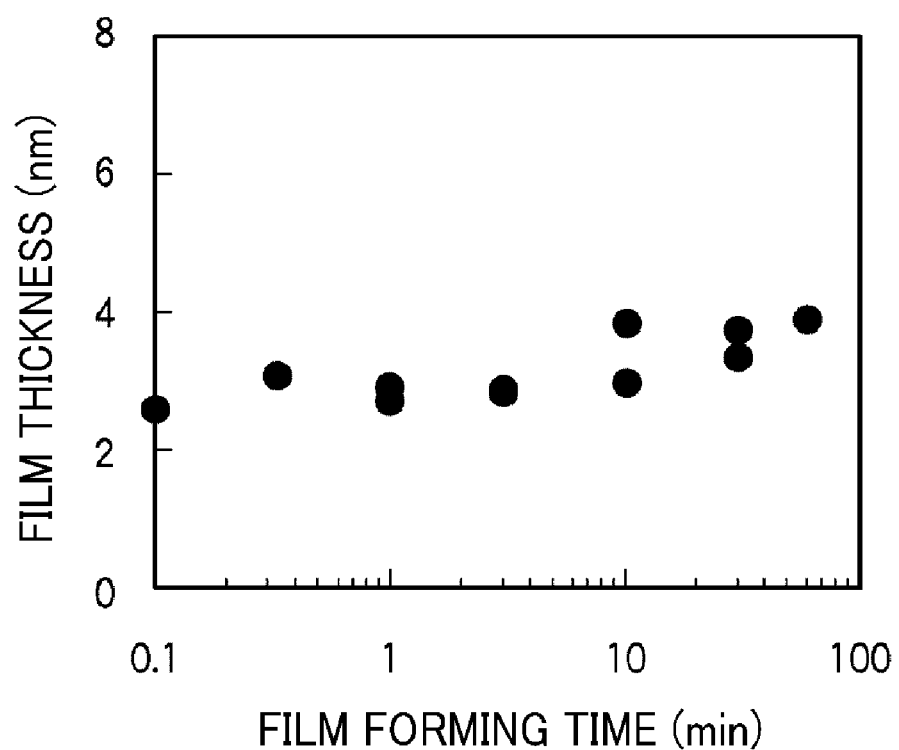
FIG. 2 is a diagram showing a self-limiting property of manganese oxide.

In the semiconductor device manufacturing method in accordance with the first embodiment, the manganese oxide film 3 formed by a CVD method is used as the dielectric film of the capacitor. The manganese oxide film 3 formed by the CVD method has a so-called "self-limiting" property, as shown in FIG. 2, and, thus, it does not grow beyond a certain thickness regardless of the length of film forming time. A thickness limit of the manganese oxide film 3 formed by the CVD method ranges from about 2 nm to about 6 nm, and the film 3 usually reaches the thickness limit within about 1 min of film forming time.

As stated, the film thickness limit of the manganese oxide film 3 formed by the CVD method ranges from about 2 nm to about 6 nm. Accordingly, if the manganese oxide film 3 is used as the dielectric film of the capacitor, the thickness of the dielectric film of the capacitor can be reduced. Further, even if the film forming time exceeds about 1 min, the thickness of the manganese oxide film 3 does not increase anymore but is maintained at about 2 nm to about 6 nm regardless of the film forming time afterwards. Thus, the film forming time need not be controlled precisely so as to form the thin dielectric film of the capacitor, which facilitates the formation of the thin dielectric film of the capacitor.

Furthermore, since the manganese oxide film 3 is non-crystalline, reduction of a leakage current between the lower electrode 1 and the upper electrode 4 can be expected.

In addition, since the manganese oxide film 3 can be formed at a low temperature of, e.g., about 100° C. to about 200° C., it has advantages when applied to a system LSI including a combination of a memory device and a logic device.

Moreover, the manganese oxide film 3 is composed of 2 elements of oxygen and manganese. Thus, a control of film composition becomes easier than in case of forming the dielectric film of the capacitor by using a plurality of elements, e.g., more than 2 elements, such as BST or STO.

Accordingly, in accordance with the first embodiment, it is possible to provide a semiconductor device manufacturing method for a capacitor having a dielectric film which can be formed into a thin film, can be formed at a low temperature, and has a readily controllable property.

(Configuration of an Apparatus)

Hereinafter, an example manganese oxide film forming apparatus (manganese oxide CVD apparatus) will be described.

Figure 3:
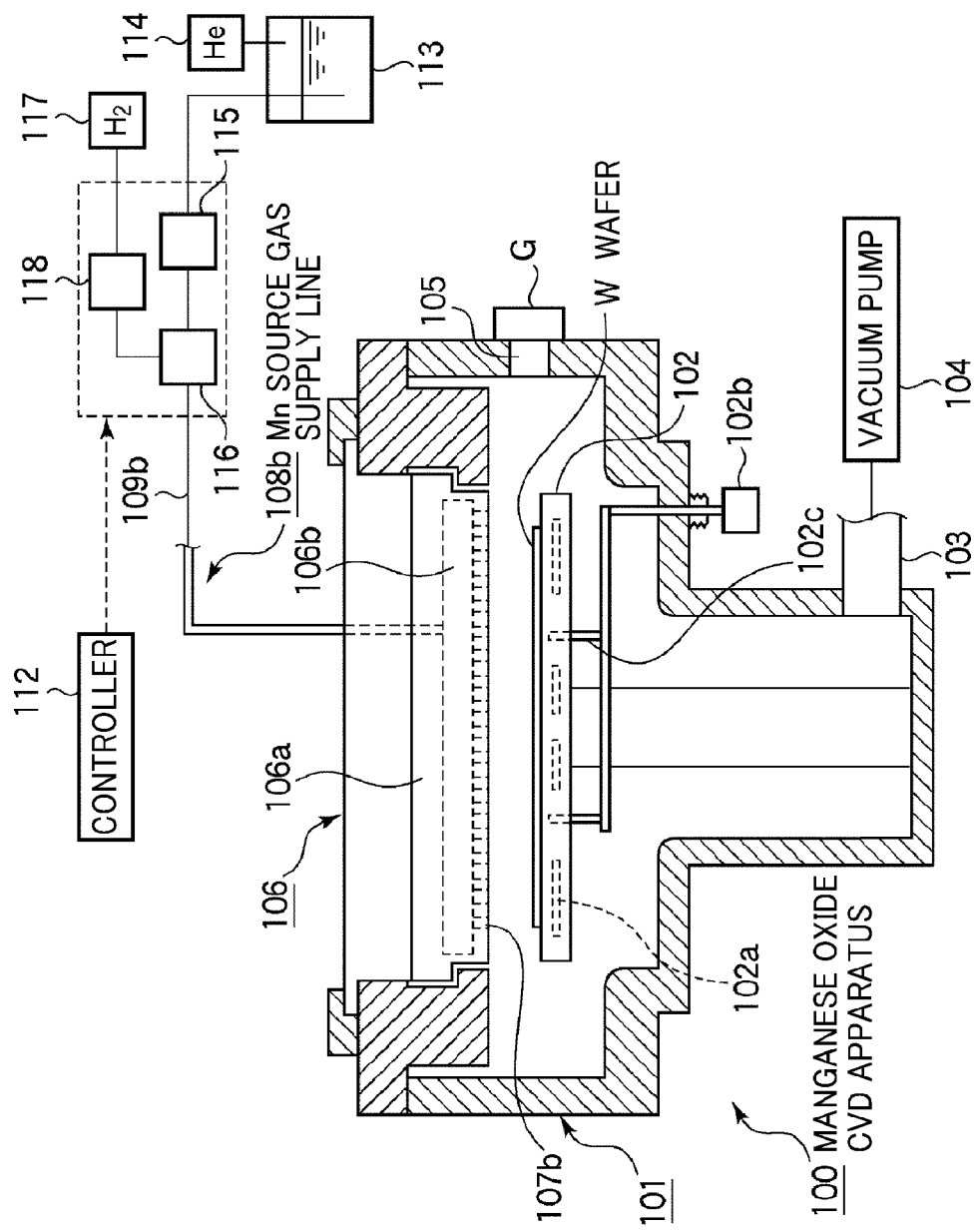
FIG. 3 is a cross sectional view schematically illustrating an example manganese oxide film forming apparatus that can be used to perform the example semiconductor device manufacturing method in accordance with the first embodiment.

FIG. 3 is a cross-sectional view schematically showing an example manganese oxide film forming apparatus which can be used to perform the example of the manufacturing method semiconductor device in accordance with the first embodiment.

As shown in FIG. 3, the manganese oxide CVD apparatus 100 includes a processing chamber 101 serving as a vacuum chamber. A mounting table 102 for horizontally mounting a wafer W thereon is installed inside the processing chamber 101. A heater 102a for adjusting a temperature of the wafer is installed within the mounting table 102. Further, three elevating pins 102c (only two of them are illustrated here for simplicity) capable of being moved up and down by an elevating mechanism 102b are installed in the mounting table 102. The wafer W is transferred between the mounting table 102 and a non-illustrated wafer transfer mechanism by these elevating pins 102c.

Furthermore, one end of an exhaust pipe 103 is connected to a lower portion of the processing chamber 101 and the other end of the exhaust pipe 103 is connected to a vacuum pump 104. At a side wall of the processing chamber 101, there is provided a transfer port 105 which can be opened and closed by a gate valve G.

At a ceiling portion of the processing chamber 101, there is installed a gas shower head facing the mounting table 102. The gas shower head 106 includes gas chambers 106a and 106b partitioned separately from each other, and gases supplied into the gas chambers 106a and 106b are supplied into the processing chamber 101 through gas supply holes 107a and 107b, respectively (post-mix method). Alternatively, the apparatus can have a configuration in which the gas chambers 106a and 106b are not separated (pre-mix method).

The gas shower head 106 is connected to a Mn source gas supply line 108b that introduces a vapor of a manganese-containing organic compound into the gas chamber 106b. The Mn source gas supply line 108b includes a source gas supply passage 109b, and a source storage 113 is connected to an upstream side of the source gas supply passage 109b.

The source storage 113 stores therein the manganese-containing organic compound, such as (EtCp)$_2$Mn (Bis(ethylcyclopentadienyl)manganese), in a liquid phase. Further, the source storage 113 is connected to a pressing unit 114, and a He gas or an Ar gas supplied from the pressing unit 114 pressurizes the inside of the source storage 113, whereby the (EtCp)$_2$Mn can be flown toward the gas shower head 106.

Further, a flow rate controller 115 including a liquid mass flow controller and/or a valve, and a vaporizer 116 for vaporizing the (EtCp)$_2$Mn are installed at the source gas supply passage 109b in this sequence from the upstream side. The vaporizer 116 allows the (EtCp)$_2$Mn to come into contact with a H$_2$ gas serving as a carrier gas supplied from a carrier gas supply source 117, and mixes them, vaporizes the (EtCp)$_2$Mn. Then, the vaporizer 116 supplies the vaporized (EtCp)$_2$Mn into the gas chamber 106b.

Here, although the vaporizer is used to vaporize the Mn source, a bubbling method may be employed instead.

Further, a reference number 118 of in FIG. 3 denotes a flow rate controller which controls a start and a stop of the supply of the vapor of the manganese-containing organic compound into the gas chamber 106b by controlling a flow rate of the carrier gas in response to a control signal from a controller 112 to be described below.

The controller 112 includes a data processor including a program, a memory, and a CPU. The program includes commands (steps) for implementing each processing step by sending a control signal to each component of the manganese oxide CVD apparatus 100 from the controller 112. Further, for example, the memory includes storage areas where process parameters such as a processing pressure, a processing temperature, a processing time, a gas flow rate and a power value are written. When the CPU executes each command of the program, these process parameters are read out, and control signals corresponding to the parameters are sent to the respective components of the manganese oxide CVD apparatus 100. This program (including a program for inputting or displaying the process parameters) is stored in a non-illustrated storage unit, i.e., a computer-readable storage medium such as a hard disc, a compact disc, a magneto-optical disc (MO), a flexible disk, and is installed in the controller 112.

With the manganese oxide CVD apparatus 100 having the above-described configuration, by reacting the vapor of the manganese-containing organic compound, e.g., the vapor of (EtCp)$_2$Mn, with oxygen (O) contained in the oxide film 2 or the oxynitride film 2', the manganese oxide film 3 for serving as the dielectric film of the capacitor with the oxide film 2 or the oxynitride film 2' can be formed on the surface of the oxide film 2 or the oxynitride film 2'.

Further, in the manganese oxide CVD apparatus 100, the (EtCp)$_2$Mn [=Mn(C$_2$H$_5$C$_5$H$_4$)$_2$] is used as the manganese-containing organic compound. Instead of the (EtCp)$_2$Mn, however, it may be possible to use one or more organic compound selected from a group consisting of Cp$_2$Mn[=Mn(C$_5$H$_5$)$_2$], (MeCp)$_2$Mn[=Mn(CH$_3$C$_5$H$_4$)$_2$], (i-PrCp)$_2$Mn[=Mn(C$_3$H$_7$C$_5$H$_4$)$_2$], MeCpMn(CO)$_3$[=(CH$_3$C$_5$H$_4$)Mn(CO)$_3$], (t-BuCp)$_2$Mn[=Mn(C$_4$H$_9$C$_5$H$_4$)$_2$], CH$_3$Mn(CO)$_5$, Mn(DPM)$_3$[=Mn(C$_{11}$H$_{19}$O$_2$)$_3$], Mn(DMPD)(EtCp)[=Mn(C$_7$H$^{11}$C$_2$H$_5$C$_5$H$_4$)], Mn(DPM)$_2$[=Mn(C$_{11}$H$_{19}$O$_2$)$_2$], Mn(acac)$_3$[=Mn(C$_5$H$_7$O$_2$)$_3$], Mn(hfac)$_2$[=Mn(C$_5$HF$_6$O$_2$)$_3$], and ((CH$_3$)$_5$Cp)$_2$Mn[=Mn((CH$_3$)$_5$C$_5$H$_4$)$_2$].

(Second Embodiment)

In a MIS-structured capacitor, there is a structure called a HSG (HemiSpherical Grain) structure having irregularities on a surface of the lower electrode 1 so as to increase a facing area between the lower electrode 1 and the upper electrode 4. The semiconductor device manufacturing method in accordance with the present disclosure can also be applied to such a HSG-structured capacitor. Below, such an embodiment will be explained as a semiconductor device manufacturing method in accordance with a second embodiment of the present disclosure.

(Manufacturing Method)

FIGS. 4A to 4F are cross sectional views illustrating an example semiconductor device manufacturing method in accordance with the second embodiment of the present disclosure. FIGS. 4A to 4F illustrate a manufacturing process for a capacitor. Among various structures formed on a semiconductor substrate (e.g., a silicon wafer), only the capacitor is illustrated in FIGS. 4A to 4D, while the rest are omitted.

Figure 4A:
FIGS. 4A to 4F are cross sectional views illustrating an example semiconductor device manufacturing method in accordance with a second embodiment of the present disclosure.

First, by cleaning the semiconductor substrate (not shown) with a cleaning/drying apparatus, a lower electrode (e.g., polysilicon) 1 is cleaned and dried (see FIG. 4A).

Figure 4B:
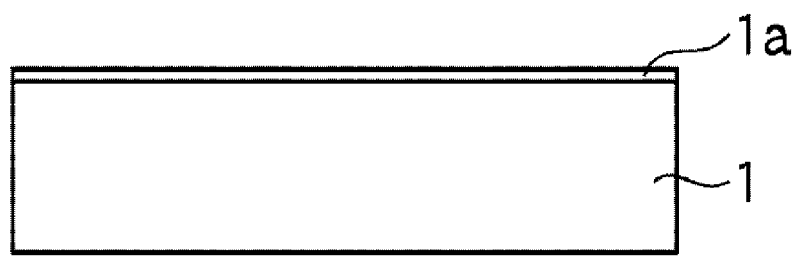

Then, a non-crystalline silicon layer 1a is formed on the lower electrode 1 by a CVD apparatus (see FIG. 4B).

Figure 4C:
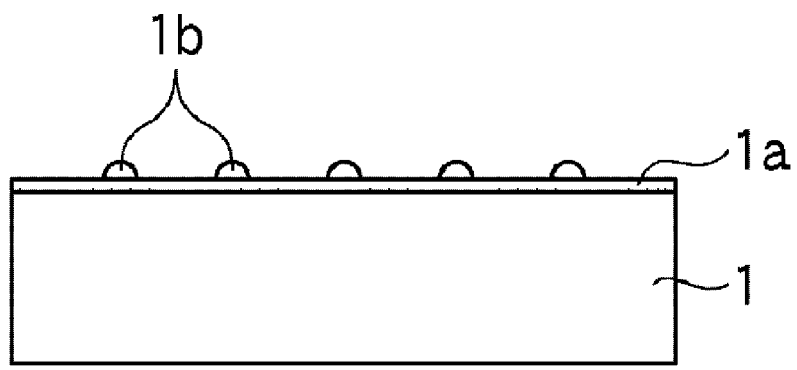

Then, grain-shaped silicon layers 1b are formed on the non-crystalline silicon layer 1a by the CVD apparatus (see FIG. 4C).

Figure 4D:
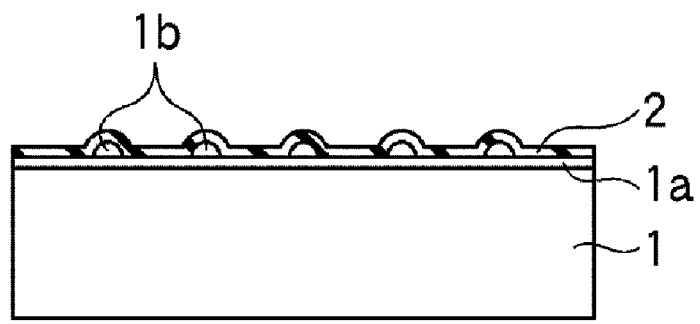
Figure 4E:
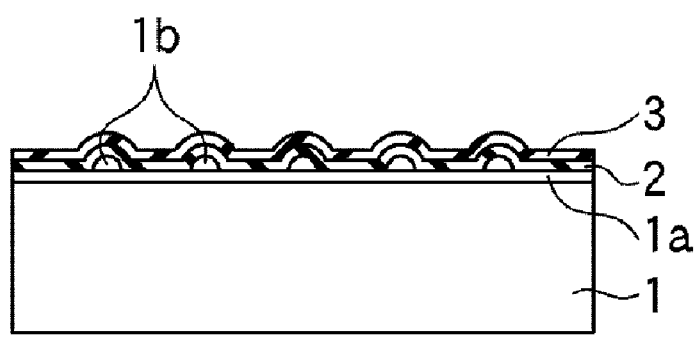

Subsequently, the non-crystalline silicon layer 1a and the grain-shaped silicon layers 1b are oxidized by an oxidizing apparatus, whereby an oxide film 2 is formed on the non-crystalline silicon layer 1a and the grain-shaped silicon layers 1b (see FIG. 4D).

Then, a manganese oxide film 3 is formed on a surface of the oxide film 2 by a manganese oxide CVD apparatus. In this case, a film forming temperature ranges from about 100° C. to about 200° C. Both the manganese oxide film 3 and the oxide film 2 serve as a dielectric film of the capacitor. For example, in the formation of the manganese oxide film 3, vapor of a manganese-containing organic compound is used, but an oxygen-containing gas is not used. An oxygen source for the manganese oxide film 3 is the oxide film 2 (See FIG. 4E).

Figure 4F:
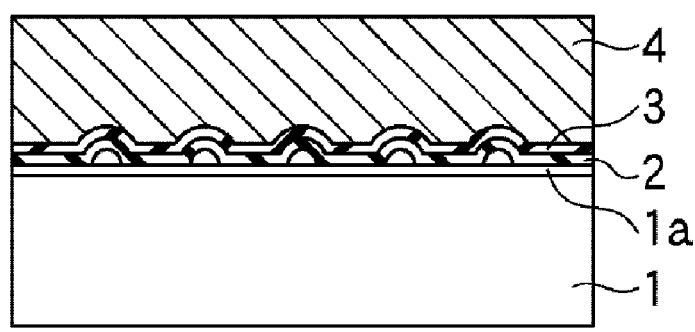

Subsequently, an upper electrode 4 made of a material such as copper is formed on the manganese oxide film 3 by a PVD apparatus (see FIG. 4F).

In the second embodiment as described above, since the manganese oxide film 3 is used as the dielectric film of the capacitor, it is possible to provide a semiconductor device manufacturing method for a capacitor having a dielectric film which can be formed into a thin film, can be formed at a low temperature, and has a readily controllable property.

(Third Embodiment)

The oxygen source of the manganese oxide film 3 is not limited to the oxide film or the oxynitride film. The manganese oxide film 3 can also be formed by adding an oxidizing agent during its film formation. This method can be applied to any of the cases that the electrode of the MIS capacitor is flat or it has irregularities such as the HSG structure. Hereinafter, such an embodiment will be discussed as a semiconductor device manufacturing method in accordance with a third embodiment of the present disclosure.

(Manufacturing Method)

Figure 5A:
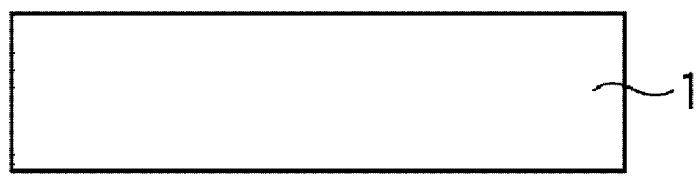
FIGS. 5A to 5C provide cross sectional views illustrating an example semiconductor device manufacturing method in accordance with a third embodiment of the present disclosure.
Figure 5B:
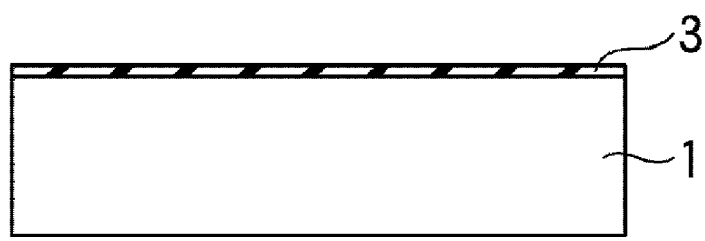
Figure 5C:
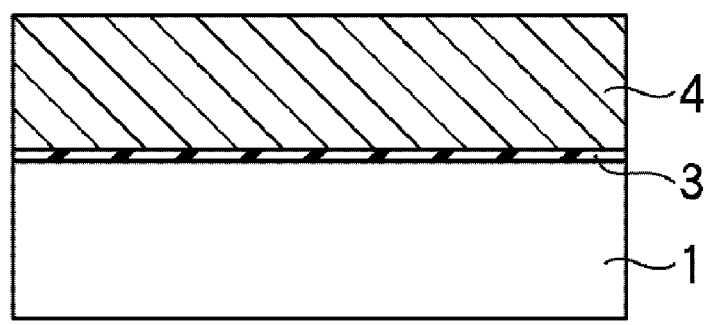

FIGS. 5A to 5C are cross sectional views illustrating an example semiconductor device manufacturing method in accordance with the third embodiment of the present disclosure. FIGS. 5A to 5C illustrate a manufacturing process for a capacitor having a MIS structure, wherein only the capacitor is illustrated among various structures formed on a semiconductor substrate (e.g., a silicon wafer), while the rest are omitted.

First, by cleaning the semiconductor substrate (not shown) with a cleaning/drying apparatus, a lower electrode (e.g., polysilicon) 1 is cleaned and dried (see FIG. 5A).

Subsequently, a manganese oxide film 3 is formed on a surface of the lower electrode 1 by a manganese oxide CVD apparatus. In this case, a film forming temperature ranges from, e.g., about 100° C. to about 200° C. The manganese oxide film 3 serves as a dielectric film of the capacitor. For example, in the formation of the manganese oxide film 3, vapor of a manganese-containing organic compound and an oxygen-containing gas such as water vapor ($H_2O$) are used. An oxygen source for the manganese oxide film 3 is the water vapor ($H_2O$) (see FIG. 5B).

Thereafter, an upper electrode 4 made of a material such as copper is formed on the manganese oxide film 3 by a PVD apparatus (see FIG. 5C).

In this way, the manganese oxide film 3 can be formed by using the vapor of the manganese-containing organic compound and the oxygen-containing gas such as $H_2O$ without the oxygen source such as the oxide film 2.

(Configuration of Apparatus)

Now, an example manganese oxide film forming apparatus (manganese oxide CVD apparatus) that can be used to perform the example semiconductor device manufacturing method in accordance with the third embodiment will be explained.

Figure 6:
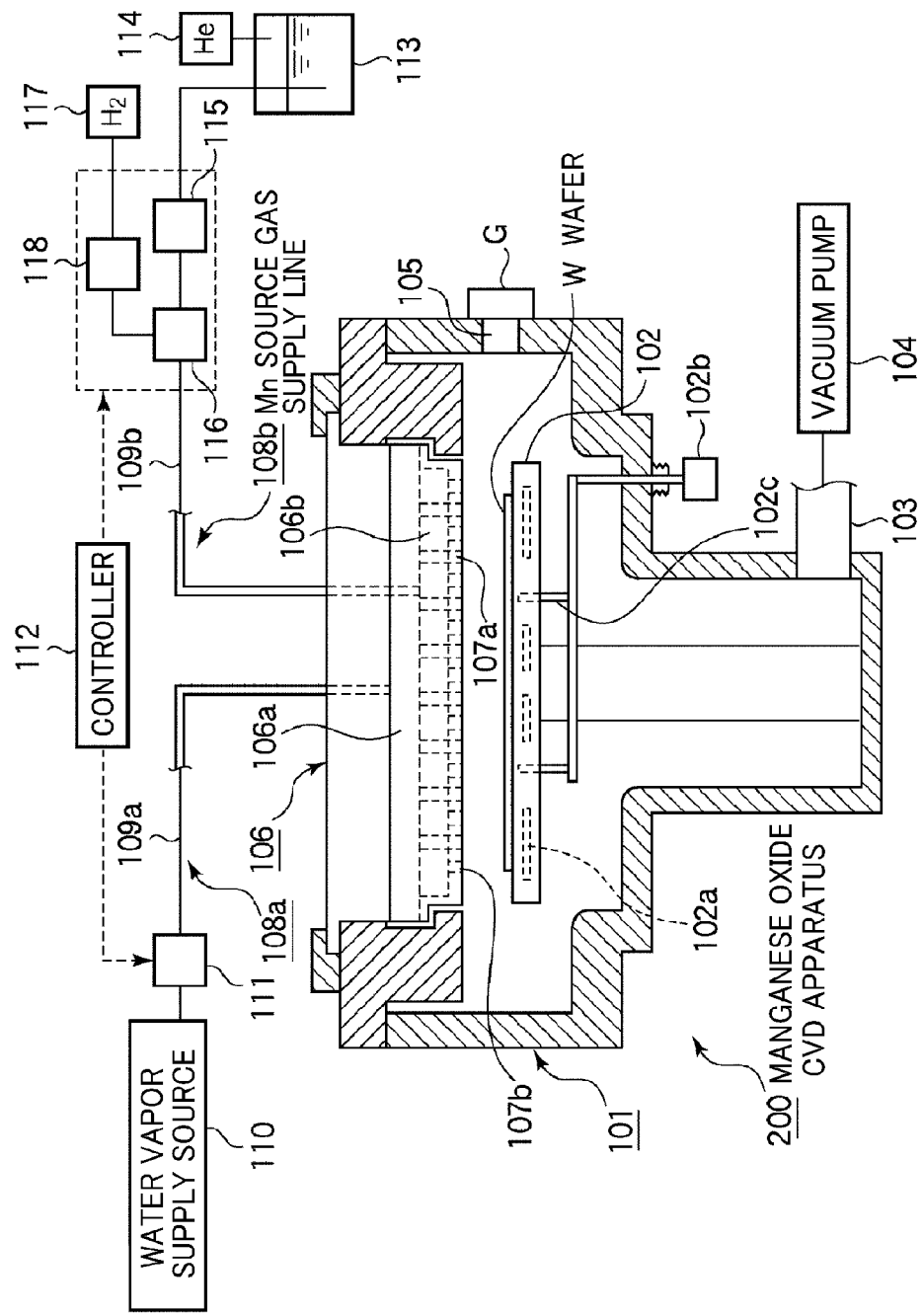
FIG. 6 is a cross sectional view schematically illustrating an example manganese oxide film forming apparatus that can be used to perform the example semiconductor device manufacturing method in accordance with the third embodiment.

FIG. 6 is a cross sectional view illustrating a cross sectional view schematically illustrating an example manganese oxide film forming apparatus applicable to the semiconductor device manufacturing method in accordance with the third embodiment of the present disclosure.

A manganese oxide CVD apparatus 200 shown in FIG. 6 is the same as the manganese oxide CVD apparatus 100 shown in FIG. 3 excepting that it further includes a water vapor supply line 108*a*. Accordingly, same parts will be assigned same reference numerals, and redundant description thereof will be omitted.

The water vapor supply line 108*a* introduces the oxygen-containing gas for forming the manganese oxide, e.g., water vapor ($H_2O$), into a gas shower head 106. The water vapor supply line 108*a* includes a water vapor supply passage 109*a*, and a water vapor supply source 110 is connected to an upstream side of the water vapor supply passage 109*a*.

Further, a reference numeral 111 denotes a flow rate controller that controls a start and a stop of the supply of the water vapor into the gas chamber 106*a* by controlling a flow rate of the wafer vapor in response to a control signal from a controller 112.

The above-described manganese oxide CVD apparatus 100 uses the water vapor ($H_2O$) as the oxygen-containing gas for forming the manganese oxide, but it may be possible to use one or more gases selected from a group consisting of $O_2$, $N_2O$, $NO_2$, $NO$, $O_3$, $H_2O_2$, $CO$, $CO_2$, and alcohols, instead of the water vapor ($H_2O$).

Here, alcohols may include ethyl alcohol and ethyl alcohol.

In accordance with the manganese oxide CVD apparatus 200 as described above, by reacting the vapor of the manganese-containing organic compound such as $(EtCp)_2Mn$, with the oxygen-containing gas, the manganese oxide film 3 for serving as a dielectric film of a capacitor is directly formed on the surface of the lower electrode 1.

(Fourth Embodiment)

There is a MIS-structured capacitor in which a silicon oxide film, for example, is interlayered as a base between a lower electrode 1 and a major dielectric film of the capacitor, such as a silicon nitride film (e.g., $Si_3N_4$), a tantalum oxide film (e.g., $Ta_2O_5$) or an aluminum oxide film (e.g., $Al_2O_3$), so as to reduce a leakage current. Here, the major dielectric film may be made of another material such as $ZrO_2$, $HfO_2$, HfSiON, or $Nb_2O_5$. The silicon oxide film can be replaced with a manganese oxide film 3 capable of further reducing the leakage current. Below, such an embodiment will be discussed as a semiconductor device manufacturing method in accordance with a fourth embodiment of the present disclosure.

(Manufacturing Method)

FIGS. 7A to 7D are cross sectional views illustrating an example semiconductor device manufacturing method in accordance with the fourth embodiment of the present disclosure. FIGS. 7A to 7D illustrate a manufacturing process for a capacitor having a MIS structure, wherein only the capacitor is illustrated among various structures formed on a semiconductor substrate (e.g., a silicon wafer), while the rest are omitted.

Figure 7A:
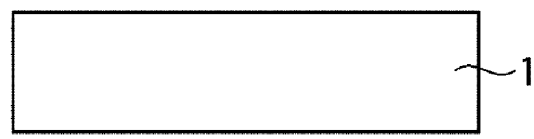
FIGS. 7A to 7D are cross sectional views illustrating an example semiconductor device manufacturing method in accordance with a fourth embodiment of the present disclosure.
Figure 7B:
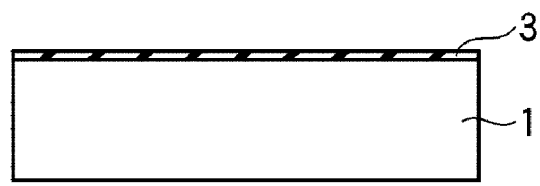

First, by cleaning the semiconductor substrate (not shown) with a cleaning/drying apparatus, a lower electrode (e.g., polysilicon) 1 is cleaned and dried (see FIG. 7A).

Then, a manganese oxide film 3 is formed on a surface of the lower electrode 1 by a manganese oxide CVD apparatus such as the manganese oxide CVD apparatus 200 shown in FIG. 6. In this case, a film forming temperature ranges from, e.g., about 100° C. to about 200° C. The manganese oxide film 3 serves as a dielectric film of the capacitor, along with a dielectric film such as an aluminum oxide film to be formed subsequently. For example, in the formation of the manganese oxide film 3, vapor of a manganese-containing organic compound and an oxygen-containing gas such as water vapor ($H_2O$) are used. An oxygen source for the manganese oxide film 3 is the water vapor ($H_2O$) (see FIG. 7B).

Figure 7C:
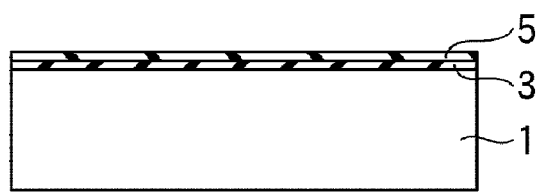

Subsequently, an aluminum oxide film (e.g., $Al_2O_3$) 5, for example, is formed on the manganese oxide film 3 by a PVD apparatus or a CVD apparatus (see FIG. 7C).

Figure 7D:
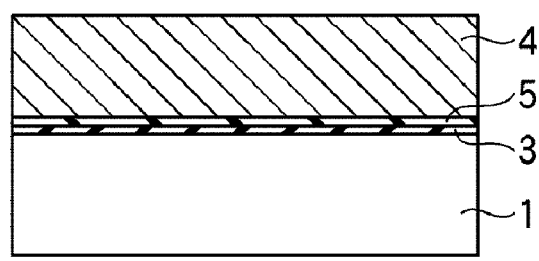

Then, an upper electrode 4 made of a material such as copper is formed on the aluminum oxide film 5 by a PVD apparatus (see FIG. 7D). Alternatively, the upper electrode 4 may be made of an aluminum alloy or silver (Ag).

In this way, the manganese oxide film 3 can be used as the base of the dielectric film of the capacitor.

(Fifth Embodiment)

There is a MIM (Metal-Insulator-Metal) capacitor in which both a lower electrode and an upper electrode are made of a metal such as copper.

A material for the upper electrode and the lower electrode of the MIM capacitor may be, e.g., Cu, Al, Ru, Ag, Ir, Pt, TaN, or TiN. A dielectric film of the MIM capacitor may be, e.g., $Ta_2O_5$, $Si_3N_4$, $Al_2O_3$, $HfO_2$, HfSiON, or $Nb_2O_5$.

In the MIM structure, if a silicon nitride film (e.g., $Si_3N_4$) or a tantalum oxide film (e.g., $Ta_2O_5$) is used as the dielectric film of the capacitor, the metal lower electrode would be oxidized, resulting in deterioration of the capacitor characteristics.

As a solution to the above-mentioned problem, a manganese oxide film 3 may be used as the dielectric film of the capacitor having the MIM structure. Below, such an embodiment will be described as a semiconductor device manufacturing method in accordance with a fifth embodiment of the present disclosure.

(Manufacturing Method)

Figure 8A:
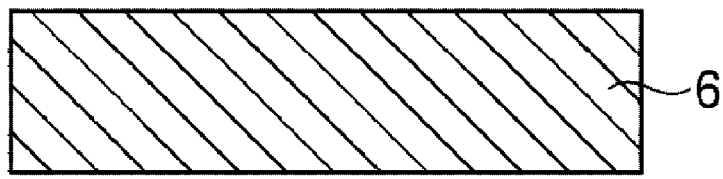
FIGS. 8A to 8C are cross sectional views illustrating an example semiconductor device manufacturing method in accordance with a fifth embodiment of the present disclosure.
Figure 8B:
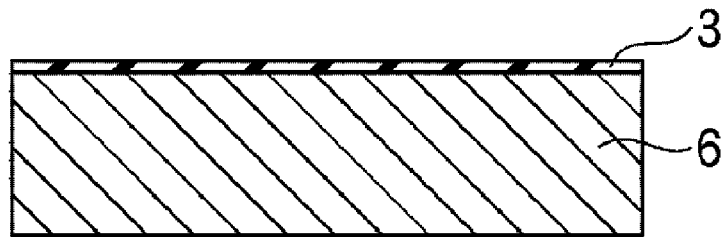
Figure 8C:
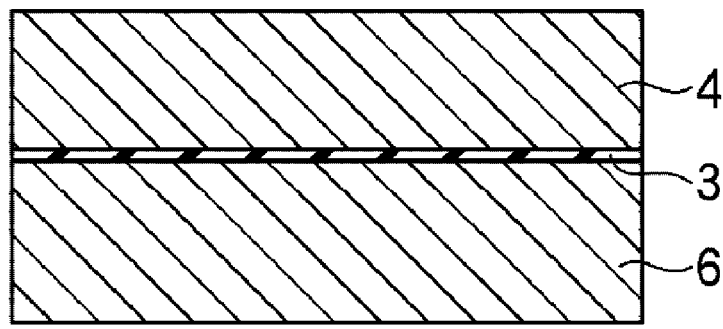

FIGS. 8A to 8C are cross sectional views illustrating an example semiconductor device manufacturing method in accordance with the fifth embodiment of the present disclosure. FIGS. 8A to 8C illustrate a manufacturing process for a capacitor, wherein only the capacitor is illustrated among various structures formed on a semiconductor substrate (e.g., a silicon wafer), while the rest are omitted.

As shown in FIG. 8A, a lower electrode 6 is a metal. In the present embodiment, the metal is copper. First, a non-illustrated substrate having the copper-made metal lower electrode 6 formed thereon is loaded into a dry-type thermal treatment apparatus. In there, a reducing agent, e.g., vapor of an organic carbonic acid such as formic acid (HCOOH) is supplied to the substrate, whereby copper oxide formed on a surface of the metal lower electrode 6 is reduced. As a result of reduction of the copper oxide by this reducing process as indicated by a reaction formula below, or as a result of chemical etching by the formic acid, the metal copper is exposed on the surface of the metal lower electrode 6.

$$Cu_2O + HCOOH \rightarrow 2Cu + H_2O + CO_2 \quad \text{(Reaction Formula)}$$

Subsequently, the substrate is loaded into the manganese oxide CVD apparatus 200 as shown in FIG. 6 while a vacuum atmosphere is maintained, and a manganese oxide film 3 is formed on the surface of the metal lower electrode 6 on which the metal copper is exposed. In this case, a film forming temperature ranges from, e.g., about 100° C. to about 200° C. The manganese oxide film 3 serves as a dielectric film. For example, in the formation of the manganese oxide film 3, vapor of a manganese-containing organic compound and an oxygen-containing gas such as water vapor ($H_2O$) are used. When the manganese-containing organic compound comes into contact with oxygen while it is being heated, it is decomposed. Further, manganese tends to be strongly bonded with oxygen. Thus, as illustrated in FIG. 8B, the manganese oxide film 3 can be formed on the metal copper exposed on the surface of the metal lower electrode 6 while a formation of an oxide on the metal lower electrode 6 is still suppressed or prevented.

Subsequently, an upper electrode 4 made of a material such as copper is formed on the manganese oxide film 3 by a PVD apparatus (see FIG. 8C).

As described, by using the manganese oxide film 3 as the dielectric film of the capacitor, the dielectric film of the capacitor can be formed while a formation of an oxide on the metal lower electrode 6 is suppressed or prevented even when the metal lower electrode 6 is made of a readily oxidizing metal such as copper.

Accordingly, in accordance with the semiconductor device manufacturing method of the fifth embodiment, deterioration of the capacitor characteristics due to the oxidation of the metal lower electrode can be avoided.

(Sixth Embodiment)

There is a MIM-structured capacitor in which an aluminum oxide film (e.g., $Al_2O_3$) is interlayered as a base between a metal lower electrode 6 and a major dielectric film, such as a tantalum oxide film (e.g., $Ta_2O_5$) so as to suppress oxidation of the metal lower electrode 6. The aluminum oxide film can be replaced with a manganese oxide film 3 that is hardly oxidizable. Such an embodiment will be discussed below as a semiconductor device manufacturing method in accordance with a sixth embodiment of the present disclosure.

(Manufacturing Method)

FIGS. 9A to 9D are cross sectional views illustrating an example semiconductor device manufacturing method in accordance with the sixth embodiment of the present disclosure. FIGS. 9A to 9D illustrate a manufacturing process for a capacitor, wherein only the capacitor is illustrated among various structures formed on a semiconductor substrate (e.g., a silicon wafer), while the rest are omitted.

Figure 9A:
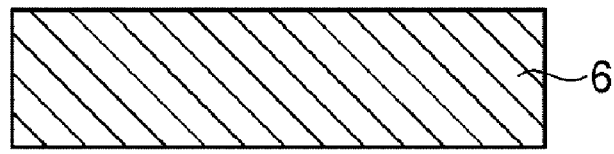
FIGS. 9A to 9D are cross sectional views illustrating an example semiconductor device manufacturing method in accordance with a sixth embodiment of the present disclosure.
Figure 9B:
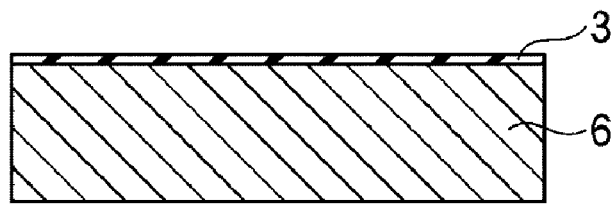

As shown in FIG. 9A, a metal lower electrode 7 is copper. First, copper oxide formed on a surface of the metal lower electrode 6 made of the copper is reduced by supplying vapor of an organic carbonic acid such as formic acid (HCOOH). By this reducing process, the metal copper is exposed on the surface of the metal lower electrode 6.

Then, the substrate is loaded into the manganese oxide CVD apparatus 200 as shown in FIG. 6 while a vacuum atmosphere is maintained, and a manganese oxide film 3 is formed on the surface of the metal lower electrode 6 on which the metal copper is exposed. In this case, a film forming temperature ranges from, e.g., about 100° C. to about 200° C. The manganese oxide film 3 serves as a dielectric film, along with a dielectric film, such as a tantalum oxide film, to be formed subsequently. For example, in the formation of the manganese oxide film 3, vapor of a manganese-containing organic compound and an oxygen-containing gas such as water vapor ($H_2O$) are used. Accordingly, the manganese oxide film 3 can be formed on the metal copper exposed on the surface of the metal lower electrode 6 while a formation of an oxide on the metal lower electrode 6 is still suppressed or prevented (see FIG. 9B).

Figure 9C:
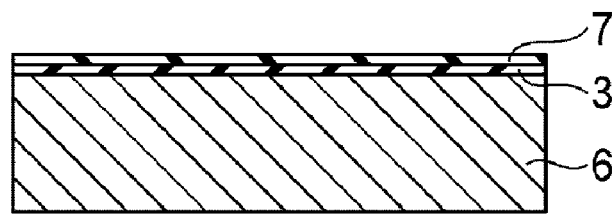

Thereafter, a tantalum oxide film (e.g., $Ta_2O_5$) 7 is formed on the manganese oxide film 3 by a PVD apparatus (see FIG. 9C).

Figure 9D:
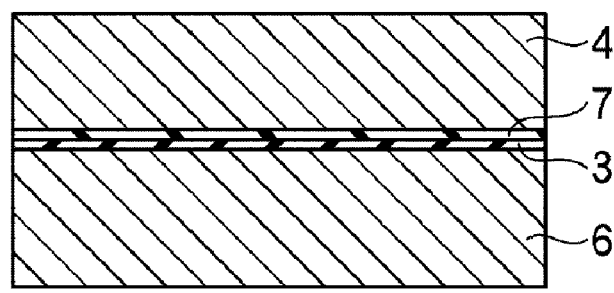

Afterwards, an upper electrode made of a material such as copper is formed on the tantalum oxide film 7 by the PVD apparatus (see FIG. 9D).

As described, the manganese oxide film 3 can be used as a base of the dielectric film of the MIM-structured capacitor.

In the above, while the invention has been described with respect to the embodiments, it is clear that the above-described embodiments are illustrative in all aspects and do not limit the present disclosure. Thus, it would be understood by those skilled in the art that various changes and modifications may be made without changing technical conception and essential features of the present disclosure.

For example, in the above-described embodiments, although the manganese oxide film 3 is formed by a thermal CVD method in which the wafer is heated while vapor of a manganese-containing organic compound and an oxygen gas are supplied onto the lower electrode 1 or the metal lower electrode 6, the manganese oxide film can be formed by another method, such as a plasma CVD method or a photo CVD method.

Moreover, as a modification of these CVD methods, it may be also possible to form the manganese oxide film 3 by way of depositing ultra-thin films by an ALD (Atomic Layer Deposition) method in which vapor of a manganese-containing organic compound and an oxygen-containing gas ($O_2$, $H_2O$, or the like) are supplied onto the lower electrode 1 or the metal lower electrode 6 intermittently.

What is claimed is:

1. A semiconductor device manufacturing method comprising:
    performing a reducing process on a metal conductor for serving as one electrode of a capacitor, in order to reduce metal oxide formation on a surface of the metal conductor.
    forming, on the metal conductor, a manganese oxide film for serving as a dielectric film of the capacitor; and
    forming, on the manganese oxide film, a conductive film for serving as the other electrode of the capacitor.

2. The manufacturing method of claim 1, wherein an oxygen-containing gas is used in the formation of the manganese oxide film.

3. A semiconductor device manufacturing method comprising:

performing a reducing process on a metal conductor for serving as one electrode of a capacitor, in order to reduce metal oxide formation on a surface of the metal conductor, forming, on the metal conductor, a manganese oxide film for serving as a dielectric film of the capacitor;

forming, on the manganese oxide film, a dielectric material film for serving as the dielectric film of the capacitor along with the manganese oxide film; and forming, on the dielectric material film, a conductive film for serving as the other electrode of the capacitor.

4. The manufacturing method of claim 3, wherein the dielectric material film is a tantalum oxide film.

* * * * *